(12) United States Patent
Stumbo et al.

(10) Patent No.: US 7,786,024 B2
(45) Date of Patent: Aug. 31, 2010

(54) SELECTIVE PROCESSING OF SEMICONDUCTOR NANOWIRES BY POLARIZED VISIBLE RADIATION

(75) Inventors: David P. Stumbo, Belmont, CA (US); Yaoling Pan, Princeton, NJ (US); Costas P. Grigoropoulos, Berkeley, CA (US); Nipun Misra, Berkeley, CA (US)

(73) Assignees: Nanosys, Inc., Palo Alto, CA (US); Regents of the University of California, Oakland, CA (US)

( * ) Notice: Subject to any disclaimer, the term of this patent is extended or adjusted under 35 U.S.C. 154(b) by 197 days.

(21) Appl. No.: 11/936,590

(22) Filed: Nov. 7, 2007

(65) Prior Publication Data

US 2008/0150165 A1 Jun. 26, 2008

Related U.S. Application Data

(60) Provisional application No. 60/872,015, filed on Nov. 29, 2006.

(51) Int. Cl.
*H01L 21/00* (2006.01)
(52) U.S. Cl. .................. 438/795; 438/796; 438/797
(58) Field of Classification Search .............. 257/1, 257/109, 471, 476, 67; 438/758, 795, 800
See application file for complete search history.

(56) References Cited

U.S. PATENT DOCUMENTS

| | | | |
|---|---|---|---|
| 2,123,902 A | 7/1938 | Land | |
| 4,949,348 A | 8/1990 | Nguyen et al. | |
| 5,505,928 A | 4/1996 | Alivisatos et al. | |
| 5,690,807 A | 11/1997 | Clark, Jr. et al. | |
| 5,751,018 A | 5/1998 | Alivisatos et al. | |
| 5,897,945 A | 4/1999 | Lieber et al. | |
| 5,920,078 A | 7/1999 | Frey | |
| 5,962,863 A | 10/1999 | Russell et al. | |
| 5,990,479 A | 11/1999 | Weiss et al. | |
| 5,997,832 A | 12/1999 | Lieber et al. | |
| 6,036,774 A | 3/2000 | Lieber et al. | |
| 6,048,616 A | 4/2000 | Gallagher et al. | |
| 6,136,156 A | 10/2000 | El-Shall et al. | |
| 6,225,198 B1 | 5/2001 | Alivisatos et al. | |

(Continued)

OTHER PUBLICATIONS

Ruda et al. "Polarization-sensitive optical phenomenon in semiconducting and metallic nanowires".*

(Continued)

*Primary Examiner*—Thanh V Pham
*Assistant Examiner*—Errol Fernandes
(74) *Attorney, Agent, or Firm*—Fiala & Weaver P.L.L.C

(57) ABSTRACT

Methods, systems, and apparatuses for annealing semiconductor nanowires and for fabricating electrical devices are provided. Nanowires are deposited on a substrate. A plurality of electrodes is formed. The nanowires are in electrical contact with the plurality of electrodes. The nanowires are doped. A polarized laser beam is applied to the nanowires to anneal at least a portion of the nanowires. The nanowires may be aligned substantially parallel to an axis. The laser beam may be polarized in various ways to modify absorption of radiation of the applied laser beam by the nanowires. For example, the laser beam may be polarized in a direction substantially parallel to the axis or substantially perpendicular to the axis to enable different nanowire absorption profiles.

13 Claims, 10 Drawing Sheets

U.S. PATENT DOCUMENTS

| | | | |
|---|---|---|---|
| 6,256,767 | B1 | 7/2001 | Kuekes et al. |
| 6,274,007 | B1 | 8/2001 | Smirnov et al. |
| 6,306,736 | B1 | 10/2001 | Alivisatos et al. |
| 6,413,489 | B1 | 7/2002 | Ying et al. |
| 6,438,025 | B1 | 8/2002 | Skarupo |
| 6,447,663 | B1 | 9/2002 | Lee et al. |
| 6,458,430 | B1 | 10/2002 | Bernstein et al. |
| 6,465,813 | B2 | 10/2002 | Ihm |
| 6,489,589 | B1 | 12/2002 | Alexander |
| 6,566,704 | B2 | 5/2003 | Choi et al. |
| 6,586,785 | B2 | 7/2003 | Flagan et al. |
| 6,593,065 | B2 | 7/2003 | Scherer |
| 6,672,925 | B2 | 1/2004 | Talin et al. |
| 6,706,566 | B2 | 3/2004 | Avouris et al. |
| 6,760,245 | B2 | 7/2004 | Eaton et al. |
| 6,781,166 | B2 | 8/2004 | Lieber et al. |
| 6,798,000 | B2 | 9/2004 | Luyken et al. |
| 6,815,218 | B1 | 11/2004 | Jacobson et al. |
| 6,872,645 | B2 | 3/2005 | Duan et al. |
| 6,876,574 | B2 | 4/2005 | Giebeler et al. |
| 6,882,051 | B2 | 4/2005 | Majumdar et al. |
| 6,896,864 | B2 | 5/2005 | Clarke |
| 6,903,717 | B2 | 6/2005 | Takahashi et al. |
| 6,972,467 | B2 | 12/2005 | Zhang et al. |
| 7,011,737 | B2 | 3/2006 | Varghese et al. |
| 7,049,625 | B2 | 5/2006 | Kern et al. |
| 7,067,867 | B2 | 6/2006 | Duan et al. |
| 7,084,507 | B2 | 8/2006 | Awano |
| 7,115,916 | B2 | 10/2006 | Avouris et al. |
| 7,129,554 | B2 | 10/2006 | Lieber et al. |
| 7,195,733 | B2 | 3/2007 | Rogers et al. |
| 7,252,699 | B2 | 8/2007 | Perry et al. |
| 7,254,151 | B2 | 8/2007 | Lieber et al. |
| 7,301,199 | B2 | 11/2007 | Lieber et al. |
| 7,339,184 | B2 | 3/2008 | Romano et al. |
| 7,344,961 | B2 | 3/2008 | Romano et al. |
| 2002/0130311 | A1 | 9/2002 | Lieber et al. |
| 2003/0189202 | A1 | 10/2003 | Li et al. |
| 2004/0005258 | A1 | 1/2004 | Fonash et al. |
| 2004/0026684 | A1 | 2/2004 | Empedocles et al. |
| 2004/0036126 | A1 | 2/2004 | Chau et al. |
| 2004/0147070 | A1 | 7/2004 | Lei et al. |
| 2004/0238887 | A1 | 12/2004 | Nihey |
| 2005/0064618 | A1 | 3/2005 | Brown et al. |
| 2006/0063361 | A1 | 3/2006 | Kumar et al. |
| 2006/0233694 | A1* | 10/2006 | Sandhu et al. ........... 423/447.3 |
| 2006/0234519 | A1* | 10/2006 | Pan et al. ................... 438/795 |
| 2007/0119546 | A1 | 5/2007 | Collins et al. |
| 2008/0023693 | A1 | 1/2008 | Dubrow et al. |
| 2008/0315175 | A1* | 12/2008 | Pauzauskie et al. ........... 257/12 |

OTHER PUBLICATIONS

Feldhaus et al. "Influence of the laser fluence in infrared matrix-assisted laser desorption/ionization with a 2.94 um Er:YAG laser and a flat-top beam profile".*

Bjork, M.T. et al., "One-dimensional Steeplechase for Electron Realized" Nano Lett (2002) 2:86-90.

Cao, YW. et al., "Growth and Properties of Semiconductor Core/Shell Nanocrystals with InAs Cores" J. Am. Chem. Soc. (2000) 122:9692-9702.

Chung, S.-W et al., "Silicon nanowire devices" Am. Inst. Phys. (2000) 76(15):2068-2070.

Cui, Y. et al., "Doping and electrical transport in silicon wires" J. Phys. Chem. B (2000) 104:5213-5216.

Cui, Y. et al., "Diameter-controlled synthesis of single-crystal silicon nanowires" Appl. Phys. Lett (2001) 78 (15):2214-2216.

Dabbousi, B.O. et al., "(CdSe)ZnS core-shell quantum dots: Synthesis and characterization of a size series of highly luminescent nanocrystallites" J. Phys. Chem. B. (1997) 101:9463-9475.

Duan, X. et al., "General synthesis of compound semiconductor nanowires" Adv. Mater. (2000) 12:298-302.

Duan, X. et al., "High performance thin-film transistors using semiconductor nanowires and nanoribbons" Nature (2003) 425:274-278.

Gudicksen, M.S. et al., "Diameter-selective synthesis of semiconductor nanowires" J. Am. Chem. Soc. (2000) 122:8801-8802.

Gudicksen, M.S. et al., "Synthetic control of the diameter and length of single crystal semiconductor nanowires" J. Phys. Chem. B (2001) 105:4062-4064.

Gudicksen, M.S. et al., "Growth of nanowire superlattice structures of nanoscale photonics and electronics" Nature (2002) 415:617-620.

Jun, Y-W, et al., "Controlled synthesis of multi-armed CdS nanorod architectures using monosurfactant system" J. Am. Chem. Soc. (2001 123:5150-5151.

Liu, C. et al., "Sol-Gel Synthesis of Free-Standing Ferroelectric Lead Zirconate Titanate Nanoparticles" J. Am. Chem. Soc. (2001) 123:4344 4345.

Manna, L. et al., "Synthesis of soluble and processable rod-, arrow-, teardrop-, and tetrapod-shaped CdSe nanocrystals" J. Am. Chem. Soc. (2000) 122:12700-12706.

Manna, L. et al., "Epitaxial growth and photochemical annealing of graded Cds/ZnS shells on colloidal CdSe nanorods" J. Am. Chem. Soc. (2002) 124:7136-7145.

Morales, A.M. et al., "A laser ablation method for the synthesis of crystalling semiconductor nanowires" Science (1998) 279:208-211.

Peng, X. et al., "Epitaxial growth of highly luminescent CdSe/CdS core/shell nanocrystals with photostability and electronic accessibility" J. Am. Chem. Soc. (1997) 119:7019-7029.

Peng, X. et al., "Shape control of CdSe nanociystals" Nature (2000) 404:59-61.

Puntes, V.F. et al., "Colloidal nanocrystal shape and size control: The case of cobalt" Science (2001) 291:2115-2117.

Tans, S.J. et al., "Room-temperature transistor based on a single carbon nanotube" Nature (1998) 393:49-52.

Urban, J.J. et al., "Synthesis of single-crystalline perovskite nanowires composed of brium titanate and strontium titanate" J. Am. Chem. Soc. (2002) 124:1186-1187.

Wu, Y. et al., "Block-by-block growth of single-crystalline Si/SiGe superlattice nanowires" Nano Lett (2002) 2:83-86.

Yamada, T. "Analysis of submicron carbon nanotube field-effect transistors" Appl. Phys Letts (2000) 76(5):628-630.

Yun, W.S. et al., "Ferroelectric properties of individual barium titanate nanowires investigated by scanned probe microscopy" Nano Lett (2002) 2(5):447-450.

Feldhaus et al. "Influence of the laser fluence in infrared matrix-assisted laser desorption/ionization with a 2:94 mm Er:YAG laser and a flat-top beam profile" J. Mass Spec. (2000) 35(11):1320-1328.

Ruda et al. "Polarization-sensitive optical phenomena in semiconducting and metallic nanowires" Phys. Rev. B (2005) 72(11):115308-1-1153008-11.

Wang et al. "Highly polarized photoluminescence and photodetection from single indium phosphide nanowires" Science (2001) 293(5534):1455-1457.

* cited by examiner

502 ─┐ apply a polarized laser beam to the at least one
nanowire to anneal the at least one nanowire

602 ─┐ polarize the laser beam in a direction substantially
parallel to a lengthwise axis of the at least one nanowire

702 ─┐ polarize the laser beam in a direction substantially
perpendicular to a lengthwise axis of the at least one nanowire

SELECTIVE PROCESSING OF SEMICONDUCTOR NANOWIRES BY POLARIZED VISIBLE RADIATION This application claims the benefit of U.S. Provisional Application No. 60/872,015, filed on Nov. 29, 2006, which is incorporated by reference herein in its entirety.

STATEMENT REGARDING FEDERALLY SPONSORED RESEARCH OR DEVELOPMENT

This invention was made with government support under Contract No. W31P4Q-05-C-R193 awarded by the United States Army Aviation and Missile Command (c/o DARPA). The government has certain rights in the invention.

BACKGROUND OF THE INVENTION

1. Field of the Invention

The present invention relates to the processing of semiconductor nanowires.

2. Background of the Invention

Nanowires are drawing tremendous interest due to their unique properties like high surface to volume ratio and dimensionality. Controlled nanowire growth methods can reliably synthesize nanowires of varying composition and size. Furthermore, advances in nanowire assembly techniques have enabled devices based on nanowires to be realized. Semiconductor nanowires may be active constituents for electronics, chemical sensors, and biological sensors.

The performance of semiconductor nanowires as active components for both nano-electronics devices and large area macroelectronics applications has been extensively investigated. Nanowires provide many advantages, such as scaling. Research has indicated that the performance of nanowire devices fabricated on flexible substrates is not significantly altered when repeatedly bent. Thus, silicon nanowires and thin film transistors (TFTs) based on nanowires can be used in flexible electronics instead of amorphous or polycrystalline silicon, or organic semiconductors. Such nanowire devices formed on lightweight and cheap flexible plastic substrates have many applications, such as displays, wearable electronics, mobile computing, information storage, and bio-detection. Other material systems based on nanowires, such as polymer-nanowire composites, have applications in a variety of fields.

Doping of silicon nanowires is required for the fabrication of electronic devices incorporating semiconducting nanowires. Doping of nanowires may be performed by introducing an appropriate dopant gas during metal-catalyzed growth of the nanowires. Even though modulation of doping profiles along the length of nanowires can be achieved, accurate alignment and positioning of the appropriately doped regions of the nanowires to build functional devices using currently known assembly techniques can be extremely cumbersome. Furthermore, different types of nanowire semiconducting materials can suffer from further problems. For example, the doping of germanium nanowires with boron in presence of $B_2H_6$ can result in cone-shaped nanostructures.

Ion-implantation is a reproducible and controllable method to introduce dopants into nanowires. Ion-implantation allows precise control of the amount of introduced dopants and the location of suitably doped portions of nanowires, which is essential to enable complex nanowire devices. However, damage to the crystalline lattice of nanowires occurs during ion implantation in the form of point and extended defects, and the dopant does not necessarily end up on lattice sites, which is required for it to be electrically active. As a result, a high temperature annealing step is required to activate implanted dopants and repair the implantation damage in nanowires. However, such high temperature processing can damage the substrates on which the nanowires are being processed, such as plastic substrates.

Thus, what are needed are systems and methods for enabling the processing of nanowires on temperature sensitive substrates, without the damage to the nanowires and substrates that can result using conventional processing techniques.

SUMMARY OF THE INVENTION

Methods, systems, and apparatuses for processing semiconductor nanowires are provided. Laser annealing is used to process nanowires. For example, the laser annealing may be used to activate dopants in the nanowires, and/or to repair damage to the nanowires that may have been caused during ion implantation and/or other processing steps. Aspects of the present invention enable semiconductor nanowires to be processed in place on substrates, including on temperature sensitive substrates.

In a first aspect, one or more nanowires are doped. For example, the nanowire(s) may be doped by ion implantation or other doping technique. A polarized laser beam is applied to the doped nanowire(s) to anneal the nanowire(s). A polarization of the laser beam may be selected to modify an absorption by the nanowire(s) of the radiation of the applied laser beam. For instance, the laser beam may be circularly polarized, polarized in a direction substantially parallel to a lengthwise axis of the nanowire(s), or polarized in a direction substantially perpendicular to the axis to modify the absorption.

In another aspect, an electrical device is fabricated. One or more nanowires are deposited on a substrate. A plurality of electrodes is formed in electrical contact with the nanowire(s). The nanowire(s) is/are doped. A polarized laser beam is applied to the nanowire(s) to anneal the nanowire(s). The nanowire(s) may be aligned substantially parallel to an axis. The polarization of the laser beam may be configured to modify an absorption by the nanowire(s) of radiation of the applied laser beam. For example, the laser beam may be circularly polarized, polarized in a direction substantially parallel to the axis, or substantially perpendicular to the axis to modify the absorption.

Aspects enable the processing of semiconducting nanowires on temperature sensitive substrates (e.g., plastic, flexible, etc.). The polarized laser annealing may be performed in a manner to anneal the semiconductor nanowires, without causing damage to the semiconductor nanowires and substrate on which the nanowires reside.

In another aspect, the polarized laser annealing may be performed in a manner to melt or ablate particular nanowires. For example, in one aspect, nanowires aligned substantially perpendicularly to the polarization of the laser beam may be retained, while nanowires having other alignments, such as parallel to the polarization of the laser beam, are melted or ablated.

In another aspect, the laser beam may include a wavelength of visible light. When the substrate on which nanowires are positioned is transparent, damage to the substrate due to the laser beam may be reduced due to a relatively low absorption of visible radiation by a transparent substrate.

In a still further aspect, a system for fabricating an electrical device includes a laser and optics. The laser is configured to generate a polarized laser beam. The optics is configured to direct the polarized laser beam onto an electrical device region of a substrate. An electrical device in the electrical device region includes at least one nanowire in electrical contact with first and second electrodes. The electrical device receives the directed polarized laser beam, and the received directed polarized laser beam is configured to anneal the at least one nanowire.

In a still further aspect, the laser and/or optics may configure the polarization of the laser beam to modify an absorption by the nanowire(s) of the radiation of the applied laser beam.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

Figure 1A:
FIG. 1A is a diagram of a single crystal semiconductor nanowire.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross-sectional dimension that is less than 500 nm, and preferably, equal to or less than less than about 100 nm, and has an aspect ratio (length:width) of greater than 10, preferably greater than 50, and more preferably, greater than 100. Exemplary nanowires for use in the practice of the methods and systems of the present invention are on the order of 10's of microns long (e.g., about 10, 20, 30, 40, 50 microns, etc.) and about 100 nm in diameter.

The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g., over the central 20%, 40%, 50%, or 80% of the nanowire). A nanowire can be straight or can be e.g., curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P(BP$_6$), B—Si, Si—C, Si—Ge, Si—Sn and Ge—Sn, SiC, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag)(Al, Ga, In, Tl, Fe)(S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors. Other now known or later developed semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: B, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type dopant selected from a group consisting of: Si, Ge, Sn, S, Se and Te. Other now known or later discovered/developed dopant materials can be employed.

Additionally, the nanowires or nanoribbons can include nanotubes formed of semiconductive organic polymer materials, (e.g., pentacene), or transition metal oxides.

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

Although the focus of the detailed description primarily relates to use of nanowire thin films on plastic substrates, the substrate to which nanowires are attached may comprise other materials, including, but not limited to: a uniform substrate, e.g., a substrate of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. In addition, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within a predetermined number of degrees of a single direction, such as 30%, or other amount. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom," "vertical," "horizontal," etc.) made herein are for purposes of illustration only, and that devices of the present invention can be spatially arranged in any orientation or manner.

Embodiments of the present invention related to any type of semiconductor nanowire. FIG. 1A illustrates a single crystal semiconductor nanowire core (hereafter "nanowire") 100. Nanowire 100 is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
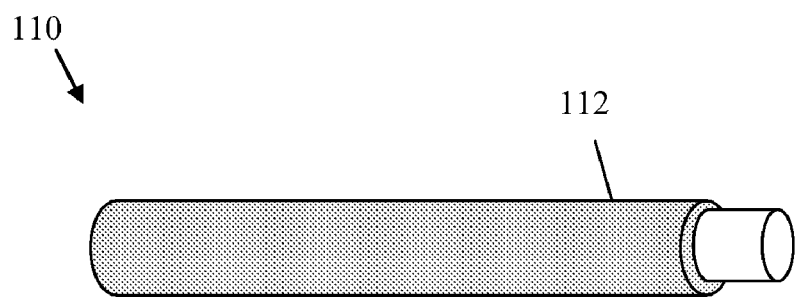
FIG. 1B is a diagram of a nanowire doped according to a core-shell (CS) structure.
Figure 1C:
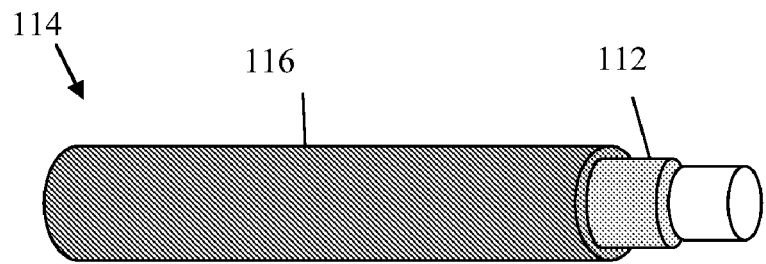
FIG. 1C is a diagram of a nanowire doped according to a core-shell-shell (CSS) structure.

FIG. 1B shows a nanowire 110 having a core-shell structure, with a shell 112 around the nanowire core. Surface scattering can be reduced by forming an outer layer of the nanowire, such as by the passivation annealing of nanowires, and/or the use of core-shell structures with nanowires. An insulating layer, such as an oxide coating, can be formed on a nanowire as the shell layer. Furthermore, for example, for silicon nanowires having an oxide coating, the annealing of the nanowires in hydrogen ($H_2$) can greatly reduce surface states. In embodiments, the core-shell combination is configured to satisfy the following constraints: (1) the shell energy level should be higher than the core energy level, so that the conducting carriers are confined in the core; and (2) the core and shell materials should have good lattice match, with few surface states and surface charges. Other more complex NW core-shell structures may also be used to include a core of single crystal semiconductor, an inner-shell of gate dielectric, and an outer-shell of conformal gate, such as shown in FIG. 1C. FIG. 1C shows a nanowire 114 having a core-shell-shell structure, with an inner shell 112 and outer shell 116 around the nanowire core. This can be realized by depositing a layer of TaAlN, WN, or highly-doped amorphous silicon around the $Si/SiO_x$ core-shell structure (described above) as the outer-gate shell, for example.

The valence band of the insulating shell can be lower than the valence band of the core for p-type doped wires, or the conduction band of the shell can be higher than the core for n-type doped wires. Generally, the core nanostructure can be made from any metallic or semiconductor material, and the one or more shell layers deposited on the core can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the one or more shell layers can comprise an oxide layer, a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe.

Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" J. Am. Chem. Soc. 122, 8801-8802; Cui et al. (2001) "Diameter-controlled synthesis of single-crystal silicon nanowires" Appl. Phys. Lett. 78, 2214-2216; Gudiksen et al. (2001) "Synthetic control of the diameter and length of single crystal semiconductor nanowires" J. Phys. Chem. B 105, 4062-4064; Morales et al. (1998) "A laser ablation method for the synthesis of crystalline semiconductor nanowires" Science 279, 208-211; Duan et al. (2000) "General synthesis of compound semiconductor nanowires" Adv. Mater. 12, 298-302; Cui et al. (2000) "Doping and electrical transport in silicon nanowires" J. Phys. Chem. B 104, 5213-5216; Peng et al. (2000) "Shape control of CdSe nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" J. Am. Chem. Soc., 124, 1186; and Yun et al. (2002) "Ferroelectric Properties of Individual Barium Titanate Nanowires Investigated by Scanned Probe Microscopy" Nanoletters 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" J. Am.

*Chem. Soc.* 123, 5150-5151; and Manna et al. (2000) "*Synthesis of Soluble and Processable Rod-, Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "Epitaxial growth and photochemical annealing of graded CdS/ZnS shells on colloidal CdSe nanorods" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application No. 60/370,095 (Apr. 2, 2002) to Empedocles entitled "Nanowire heterostructures for encoding information." Similar approaches can be applied to growth of other heterostructures.

EXAMPLE EMBODIMENTS FOR PROCESSING OF SEMICONDUCTOR NANOWIRES

Embodiments for the processing of semiconductor nanowires are described herein. Semiconductor nanowires have attracted intense interest for use in many applications such as electronics, sensors, photonics, and further applications. To utilize the electronic properties of semiconducting materials, dopants are introduced to the semiconducting materials, and are activated. In embodiments, laser annealing of semiconducting nanowires is used to activate incorporated dopants. Laser annealing is a relatively fast process, generating a high temperature rapidly, with relatively rapid heat up and cool down rates. Such laser annealing may be performed in a manner to anneal the semiconductor nanowires, without causing damage to the semiconductor nanowires and/or substrates on which the nanowires reside. For instance, embodiments enable the processing of semiconducting nanowires on temperature sensitive substrates (e.g., plastic, flexible, etc.).

The absorption of laser light in nanowires is dependent on the light wavelength, polarization, and nanowire diameter. In embodiments, nanowires having a particular diameter may be selected to provide a desired absorption profile. Furthermore, the generated laser light may be polarized in various ways, such as being circularly polarized or polarized with respect to a direction of alignment of the nanowires (e.g., perpendicular or parallel to the nanowires), to achieve various absorptions of radiation by the nanowires. In an embodiment, laser light that is parallel polarized with respect to the nanowires is absorbed more rapidly by the nanowires than laser light that is perpendicularly polarized with respect to the nanowires. This "dual threshold" characteristic may be used to selectively process nanowires depending on their orientation.

For example, polarized laser annealing may be performed to activate selected nanowires. In an embodiment, a plurality of nanowires may be radiated by a polarized laser beam. A first portion of the nanowires that includes those that are aligned substantially perpendicularly to the polarization of the laser beam. The first portion of the nanowires may be activated by the polarized laser beam. A second portion of the nanowires includes those having substantially non-perpendicular alignments, such as being parallel to the polarization of the laser beam. The second portion of the nanowires may remain un-activated by the laser beam. Thus, in such an embodiment, nanowires aligned in a desired direction may be activated, while nanowires not aligned in the desired direction may remain unactivated.

In another example, polarized laser annealing may be performed to melt or ablate selected nanowires. For example, in an embodiment, a plurality of nanowires may be radiated by a polarized laser beam. A first portion of the nanowires that includes those that are aligned substantially perpendicularly to the polarization of the laser beam. The first portion of the nanowires may be annealed, but may remain otherwise relatively unchanged by the polarized laser beam. A second portion of the nanowires includes those having substantially non-perpendicular alignments, such as being parallel to the polarization of the laser beam. The second portion of the nanowires may be melted or ablated by the laser beam. Thus, in such an embodiment, nanowires aligned in a desired direction may be retained, while nanowires not aligned in the desired direction may be removed.

Figure 2:
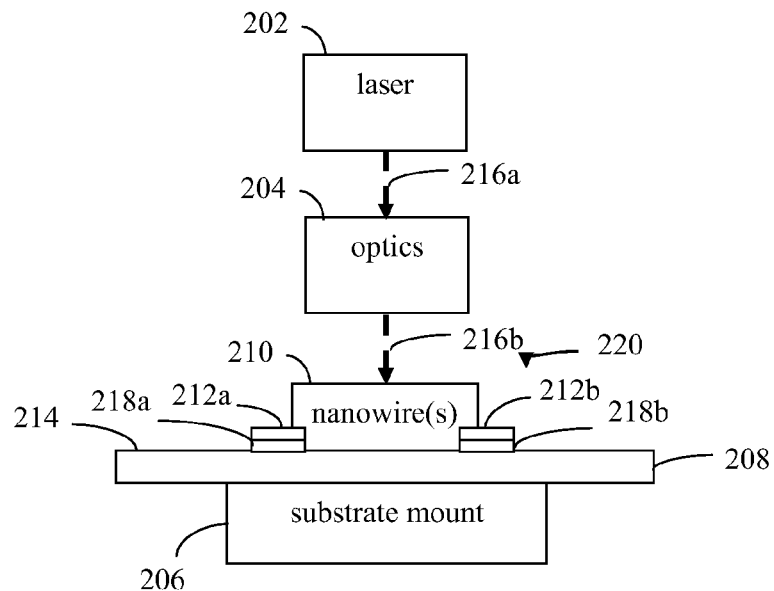
FIG. 2 shows a block diagram of a laser annealing system, according to an example embodiment of the present invention.

FIG. 2 shows a laser annealing system 200, according to an example embodiment of the present invention. As shown in FIG. 2, laser annealing system 200 includes a laser 202, optics 204, and a substrate mount 206 that mounts a substrate 208. In system 200, laser 202 is configured to generate a polarized laser beam 216, having a first portion 216a and a second portion 216b. The polarized laser beam first portion 216a is received and modified by optics 204. Optics 204 outputs a modified version of the polarized laser beam first portion 216a as polarized laser beam second portion 216b. Second portion 216b may be focused, redirected, filtered, polarized, and/or otherwise modified with respect to first portion 216a by optics 204.

Optics 204 directs polarized laser beam 216 onto an electrical device 220 positioned in an electrical device region on a surface 214 of substrate 208. Electrical device 220 includes first and second doped semiconducting contact regions 218a and 218b formed on substrate 208. Electrical device 220 further includes first and second electrodes 212a and 212b formed on contact regions 218a and 218b, respectively. At least one nanowire 210 is in electrical contact with first and second electrodes 212a and 212b on surface 214 of substrate 208. Electrical device 220 receives polarized laser beam 216 from laser 202 through optics 204. Polarized laser beam 216 is configured to anneal nanowire(s) 210.

Figure 3:
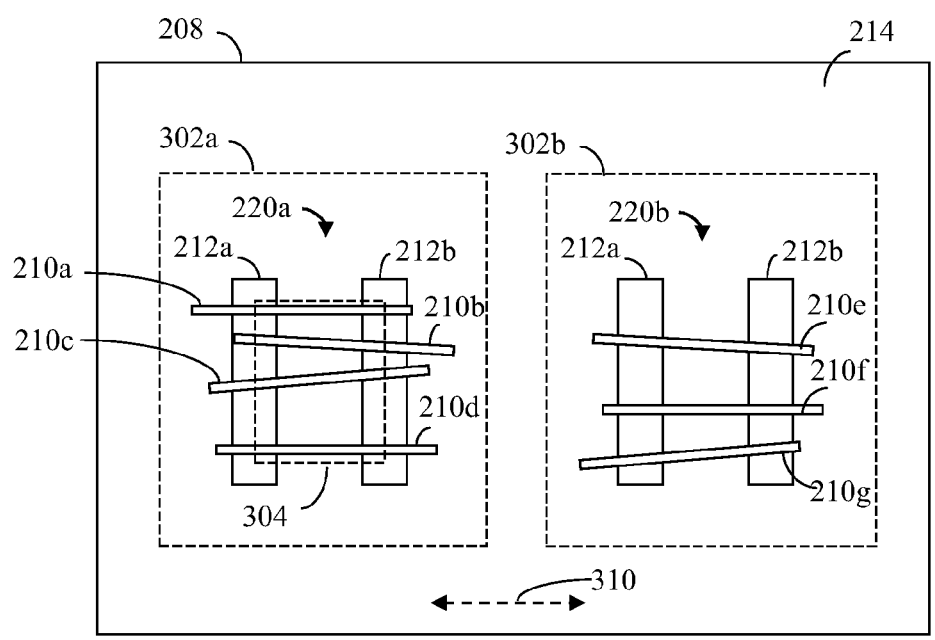
FIG. 3 shows a plan view of a substrate having electrical device regions, according to an example embodiment of the present invention.

FIG. 3 shows a plan view of surface 214 of substrate 208, according to an example embodiment of the present invention. Substrate 208 may be any type of substrate, rigid or flexible, including a polymer (e.g., plastic), glass, quartz, or other substrate type mentioned elsewhere herein or otherwise known. In the example of FIG. 3, first surface 214 of substrate 208 includes first and second electrical device regions 302a and 302b. Any number of one or more electrical device regions 302 may be present on substrate 208. First and second electrical device regions 302a and 302b include respective electrical devices 220a and 220b. Each of electrical devices 220a and 220b include respective first and second electrodes 212a and 212b, first and second contact regions 218a and 218b (not visible in FIG. 3), and nanowire(s) 210.

Nanowire(s) 210 may include one or more nanowires configured in any manner, including being configured as any of nanowires 100, 110 (e.g., a core-shell nanowire), and/or 114 (e.g., a core-shell-shell nanowire) shown in FIGS. 1A-1C. Nanowire(s) 210 may be formed any semiconducting material mentioned elsewhere herein or otherwise known. Electrical device 220a includes four nanowires 210a-210d. Electrical device 220b includes three nanowires 210e-210g. In embodiments, any number of one or more nanowires 210 may be present in contact with electrodes 212 of a particular electrical device 220.

Electrical device 220 may be any type of two-terminal electrical device, including a diode, and may include one or more further electrodes 212 to form a more complex electrical device, such as a transistor. Referring to electrical device 220 shown in FIG. 3, polarized laser beam 216 is directed onto a nanowire region 304 of electrical device 220a by optics 204. A portion or entirety of each of nanowires 210a-210d may be positioned in nanowire region 304. Nanowire region 304 may be located between first and second electrodes 212a and 212b, and may optionally include a region overlapping one or both of electrodes 212a and 212b. Portions of nanowires 210a-210d present in nanowire region 304 are annealed by polarized laser beam 216b.

Nanowires 210a-210d may be doped semiconducting nanowires, such as silicon nanowires doped with any suitable dopant material mentioned elsewhere herein or otherwise known. In embodiments, polarized laser beam 216 activates the dopants incorporated into nanowires 210a-210d. Polarized laser beam 216 may also repair damage to nanowires 210a-210d received during a dopant implantation process (e.g., ion implantation). Furthermore, polarized laser beam 216 may be configured to anneal nanowires 210a-210d while avoiding damage to substrate 208. Substrate 208 may be a temperature sensitive material, such as a polymer (e.g., a plastic), flexible or otherwise, that is typically damaged (e.g., melts, deforms, beads, etc.) when heated during a conventional thermal annealing process. Polarized laser beam 216 does not damage substrate 208 in this manner, and thus enables annealing of electrical devices 220 in place on substrate 220.

Referring back to FIG. 2, laser 202 may be any device that produces suitable coherent radiation. Laser 202 typically is configured to emit light in a narrow, low-divergence beam, as polarized laser beam 216, with a well-defined wavelength. For example, in an embodiment, polarized laser beam 216 may include a visible light wavelength. In an embodiment where substrate 208 is made of a transparent material, such as glass or quartz, a visible light wavelength may be desirable to be generated by laser 202 to further decrease a possibility of damage to substrate 208 due to polarized laser beam 216. However, in alternative embodiments, non-visible wavelengths may be generated by laser 202 in polarized laser beam 216.

Any suitable laser device may be used for laser 202, including a gas, chemical, excimer, solid state, semiconductor, dye, free electron, or other laser type. Example types of excimer lasers include $F_2$ (fluorine, emitting at 157 nm), and noble gas compounds such as ArF (193 nm), KrCl (222 nm), KrF (248 nm), XeCl (308 nm), and XeF (351 nm). Example solid-state laser types include yttrium orthovanadate (Nd:YVO4), yttrium lithium fluoride (Nd:YLF) and yttrium aluminum garnet (Nd:YAG) lasers, which can produce high powers in the infrared spectrum at 1064 nm. Such lasers are also commonly frequency doubled, tripled or quadrupled to produce 532 nm (green, visible), 355 nm (UV), and 266 nm (UV) light, for example.

In an embodiment, polarized laser beam 216 is polarized internal to laser 202. In an alternative embodiment, additional optics may be present to polarize polarized laser beam 216 externally to laser 202, such as by positioning one or more polarizing filter and/or other polarizing elements in the path of laser beam 216.

Optics 204 is optionally present to modify and/or direct polarized laser beam 216 to nanowire region 304. Any number and configuration of lenses, filters, and/or other optical elements may be present in optics 204 to modify and/or direct polarized laser beam 216 to nanowire region 304. For example, optics 204 may be configured so that nanowire(s) 210 receive a substantially uniform laser fluence by polarized laser bean 216.

Figures 4, 5, 6, 7:
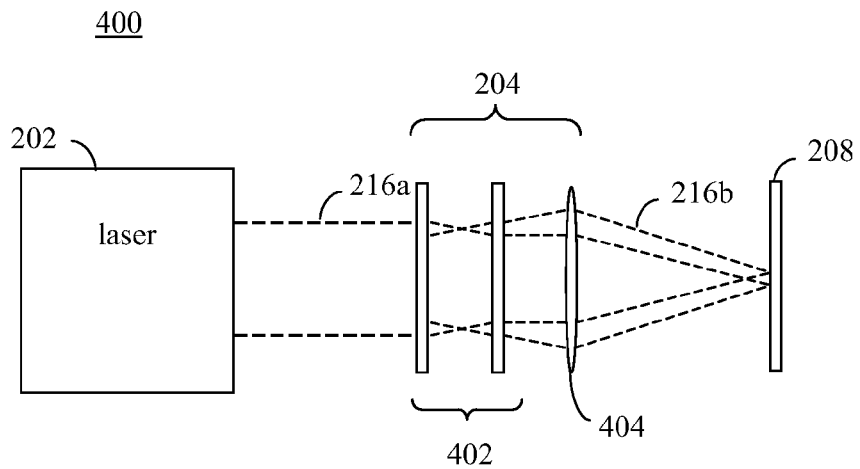
FIG. 4 shows a block diagram of a laser annealing system, according to an example embodiment of the present invention.
FIGS. 5-7 show example steps for applying a polarized laser beam to nanowires, according to embodiments of the present invention.

For instance, FIG. 4 shows a laser annealing system 400, as an example of laser annealing system 200 shown in FIG. 2, according to an embodiment of the present invention. In system 400, optics 204 includes a homogenizer assembly 402 and a focal lens 404. Homogenizer assembly 402 is configured to achieve a flat-top beam profile for polarized laser beam 216b. For instance, a flat-top beam profile having a non-uniformity of less than 10%, or other percentage (e.g., less than 5%), in the flat-top region may be generated. As shown in FIG. 4, homogenizer assembly 402 may include an array of two or more micro-lenses and/or other optical elements. The generated flat-top can be varied to any desired size, such as from a few microns, millimeters, to centimeters in area, by an appropriate choice of focal length for focal lens 404. For example, focal lens 404 may be configured such that the generated flat-top size is the size of nanowire region 304 shown in FIG. 3.

Substrate mount 206 may be any type of mounting structure suitable for mounting substrate 208 for receipt of polarized laser beam 216 as would be known to persons skilled in the relevant art(s). For example, substrate mount 206 may include a surface, mobile or immobile, for receiving substrate 208. Substrate mount 206 may include any necessary jigs, clamps, and/or further mechanisms for holding substrate 208 in place. Substrate mount 206 may include a conveyor system, or other system for moving substrate 208 from station to station during an assembly process for electrical device(s) 220 on substrate 208.

In an embodiment, systems 200 and 400 may be configured to perform step 502 shown in FIG. 5. As shown in FIG. 5, in step 502, a polarized laser beam is applied to at least one nanowire to anneal the at least one nanowire. As shown in FIGS. 2 and 4, laser 202 generates a polarized laser beam 216 which is applied to nanowire(s) 210, to anneal nanowire(s) 210. Polarized laser beam 216 may be pulsed or continuous. In a pulsed embodiment, polarized laser beam 216 may pulse according to any desired duty cycle. Furthermore, a fluence level and a pulse duty cycle of polarized laser beam 216 may be selected to anneal nanowire(s) 210 without melting nanowire(s) 210.

Polarized laser beam 216 may be polarized in any orientation, such as being circularly polarized, or polarized with respect to a position of nanowire(s). For example, in an embodiment, nanowire(s) 210 may be aligned substantially parallel to an axis, such as an axis 310 shown in FIG. 3, which is parallel to an axis through electrodes 212a and 212b. Nanowire(s) 210 may be aligned with axis 310 according to any degree, such as each of nanowire(s) 210 being parallel to axis 310 within ±10% or other amount. Polarized laser beam 216 may be polarized with respect to axis 310, such as in parallel with, or perpendicular to axis 310.

In an embodiment, step 502 of FIG. 5 may include step 602 shown in FIG. 6. In step 602, the laser beam is polarized in a direction substantially parallel to a lengthwise axis of the at least one nanowire. For instance, referring to FIGS. 2 and 3, polarized laser beam 216 generated by laser 202 may have an electric field polarized in a direction substantially parallel to axis 310. In another embodiment, step 502 of FIG. 5 may include step 702 shown in FIG. 7. In step 702, the laser beam is polarized in a direction substantially perpendicular to a lengthwise axis of the at least one nanowire. For instance, referring to FIGS. 2 and 3, polarized laser beam 216 generated by laser 202 may have an electric field polarized in a direction substantially perpendicular to axis 310. The polarization of polarized laser beam 216 relative to axis 310 can be selected to provide corresponding absorption profiles for nanowire(s) 210, as further described elsewhere herein.

Figure 8:
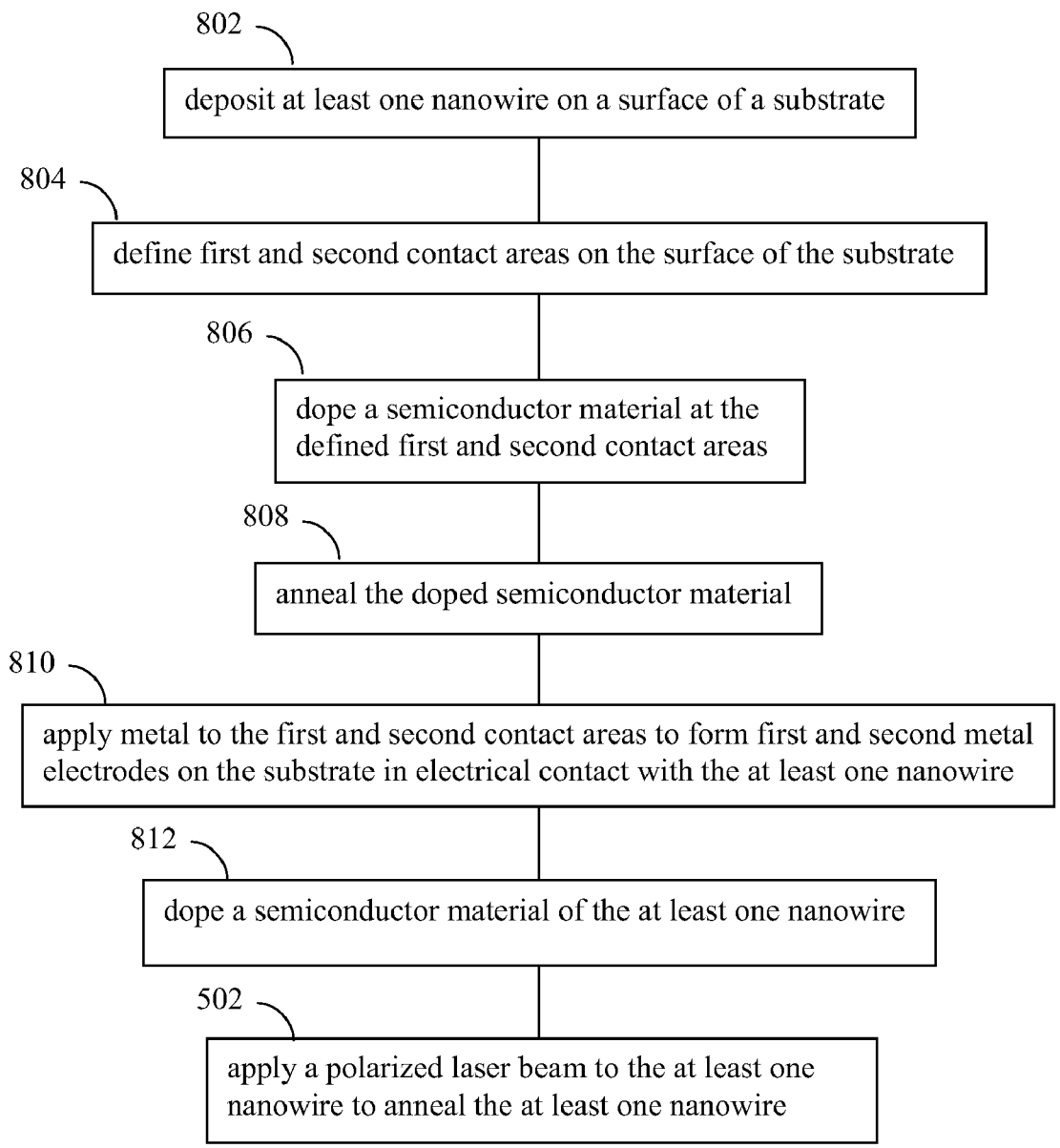
FIG. 8 shows a flowchart providing example steps for fabricating an electrical device, according to example embodiments of the present invention.
Figure 9:
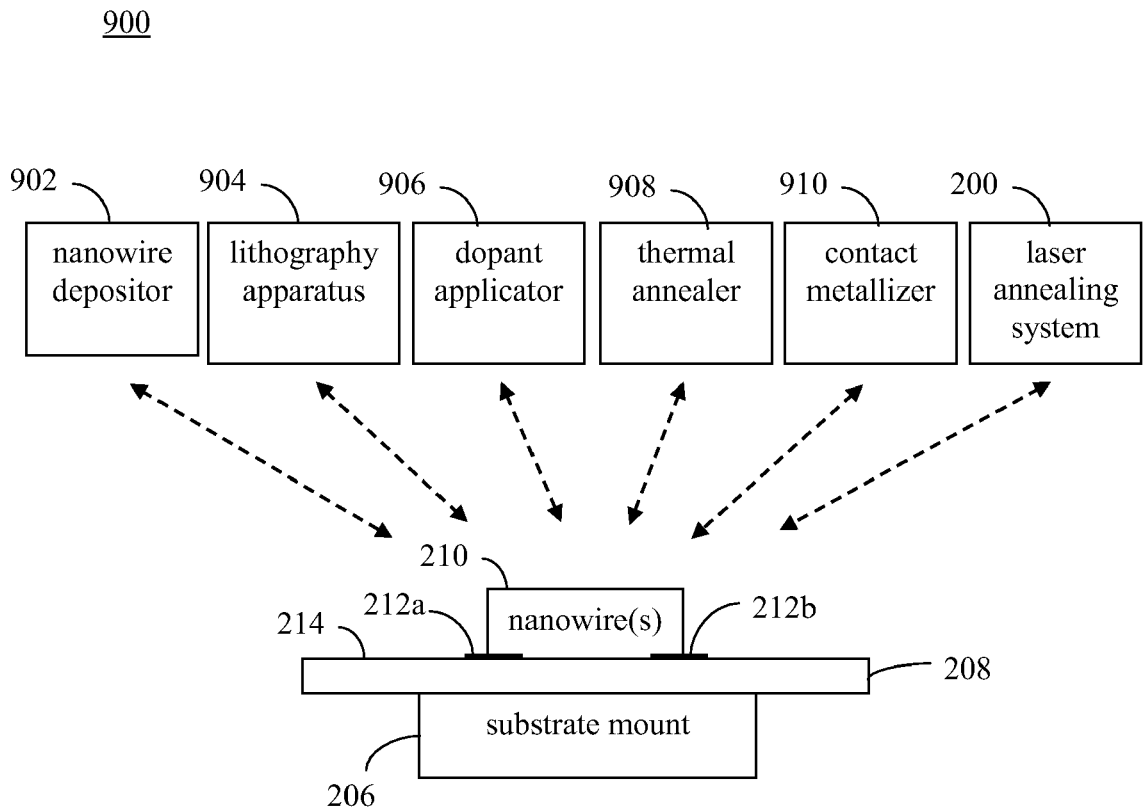
FIG. 9 shows a block diagram of an electrical device fabrication system, according to an example embodiment of the present invention.

In embodiments, laser annealing may be performed in a process of fabricating one or more electrical devices. For instance, FIG. 8 shows a flowchart 800 providing example steps for fabricating an electrical device, according to example embodiments of the present invention. Flowchart 800 may be used to fabricate one or more electrical devices, such as electrical device 220 shown in FIG. 2. For illustrative purposes, flowchart 800 is described with respect to an electrical device fabrication system 900 shown in FIG. 9, according to an example embodiment of the present invention. As shown in FIG. 9, system 900 includes a nanowire depositor 902, a lithography apparatus 904, a dopant applicator 906, a thermal annealer 908, a contact metallizer 910, and laser annealing system 200. Further structural and operational embodiments will be apparent to persons skilled in the relevant art(s) based on the discussion regarding flowchart 800. The steps of flowchart 800 may be performed in alternative orders to the order shown in FIG. 8. Not all steps of flowchart 800 are necessarily performed in all embodiments. Furthermore, one or more steps of flowchart 800 may be modified and/or additional steps may be included, depending on the particular application.

Flowchart 800 begins with step 802. In step 802, at least one nanowire is deposited on a surface of a substrate. For example, nanowire depositor 902 shown in FIG. 9 may be used to deposit nanowire(s) 210 on substrate 208 in a manner known to persons skilled in the relevant art(s). A sufficient number of nanowires 208 may be deposited to provide the characteristics desired for electrical device 220. For example, in an embodiment, nanowire depositor 902 may deposit a solution of nanowires on substrate 108, using a wet, thin film based process, such as a spin-casting, drop-and-dry, flood-and-dry, or dip-and-dry approach. In another embodiment, nanowire depositor 902 may deposit nanowires on substrate 108 using a dry deposition process, such as a "pick and place" or other dry deposition technique. For instance, nanowire depositor 902 may deposit nanowires on substrate 208 from a growth substrate using a transfer substrate, as described in U.S. Pat. No. 7,195,733 to Rogers et al. (Mar. 27, 2007), entitled "Composite Patterning Devices for Soft Lithography," and U.S. patent application Ser. No. 11/226,027, filed Sep. 14, 2007, to Dubrow et al., entitled "Methods, Devices and Compositions for Depositing and Orienting Nanostructures," now pending, which are both incorporated by reference herein in their entireties.

The deposited nanowires may also be aligned in a desired direction by the deposition process of step 802. Any alignment techniques may be used, such as Langmuir-Blodgett film alignment, fluidic flow, mechanical shear force (e.g., using a gravure coater), mechanical stretching, or other technique. Surface 214 of substrate 208 may be coated with a dielectric material prior to step 802, such as $SiO_2$ or SiN, to aid the nanowires in adhering. The deposited nanowire may be cured after deposit on substrate 208.

In step 804, first and second contact areas are defined on the surface of the substrate. In an embodiment, step 804 may be used to define first and second doped semiconductor contact regions 218a and 218b on substrate 208, as shown in FIG. 2. Lithography apparatus 904 shown in FIG. 9 may be used to define contact regions 218a and 218b on surface 214 of substrate 208, as would be known to persons skilled in the relevant art(s). In an embodiment, a mask (not shown in FIG. 9) can be used to mask selected regions of surface 214, followed by deposition of a semiconducting material (e.g., a-Si) in the exposed regions.

In step 806, a semiconductor material is doped at the defined first and second contact areas. For example, dopant applicator 906 may be used to dope a semiconductor material of substrate 208 at the defined contact areas, such as first and second contact regions 218a and 218b. In another embodiment, where substrate 208 is a semiconductor, the material of substrate 208 may be directly doped at the defined contact areas. Any dopant material mentioned elsewhere herein or otherwise known may be used in step 806. Dopant applicator 906 may be configured to perform doping according to any technique, as would be known to persons skilled in the relevant art(s). For instance, dopant applicator 906 may be configured to perform step 806 using a technique such as ion implantation, diffusion, or other doping technique mentioned elsewhere herein or otherwise known.

In step 808, the doped semiconductor material is annealed. Step 808 is optional. Step 808 may be performed in embodiments where low resistance contacts are desired, for example. Otherwise, step 808 may not necessarily be performed. When performed, thermal annealer 908 shown in FIG. 9 may be configured to anneal the semiconductor material at the defined first and second contact areas using a thermal annealing technique. Alternatively, other techniques may be used to perform step 808, as would be known to persons skilled in the relevant art(s).

In step 810, metal is applied to the first and second contact areas to form first and second metal electrodes on the substrate in electrical contact with the at least one nanowire. For example, contact metallizer 910 may be configured to perform step 810 to form electrodes 212a and 212b in electrical contact with nanowire(s) 210. Contact metallizer 910 may perform metallization of the first and second contact areas according to any metallization technique known to persons skilled in the relevant art(s), such as by painting, electroplating, evaporation, sputtering, spinning on, or in other manner mentioned elsewhere herein or otherwise known. Any suitable metal may be applied, including silver, gold, aluminum, copper, tin, nickel, other metal, or a combination of metals/alloy. Electrodes 212a and 212b may be anode and cathode contacts for a diode embodiment of electrical device 220, source and drain contacts for a transistor embodiment of electrical device 220, or other electrical contact type.

In step 812, a semiconductor material of the at least one nanowire is doped. For example, dopant applicator 906 or other doping mechanism may be used to dope a semiconductor material of nanowire(s) 210. Any doping material mentioned elsewhere herein or otherwise known may be used in step 806. Dopant applicator 906 may be configured to perform doping according to any technique, as would be known to persons skilled in the relevant art(s). For instance, dopant applicator 906 may be configured to perform step 812 using a technique such as ion implantation, diffusion, or other doping technique mentioned elsewhere herein or otherwise known. Note that in an embodiment, step 812 may be performed prior to step 802, such that nanowires(s) 210 are doped prior to deposition on substrate 208.

In step 502 of flowchart 800, a polarized laser beam is applied to the at least one nanowire to anneal the at least one nanowire. Step 502 may be performed as described above, such as by system 200 or system 400 shown in FIGS. 2 and 4, respectively, to anneal nanowire(s) 210. As described above, polarized laser beam 216 anneals nanowire(s) 210 in a manner that can be withstood by a temperature sensitive substrate 208.

Flowchart 800 may be adapted to form alternative types of electrical devices than electrical device 220 shown in FIG. 2. For example, flowchart 800 may include one or more steps for forming a third (e.g., a gate) electrode in electrical contact with nanowire(s) 210, to form a three-terminal device such as a transistor. In another example, first and second electrodes 212a and 212b may be formed after depositing (step 802) nanowire(s) 210 on substrate 208. Further adaptations may be made to flowchart 800 to form alternative electrical devices, as would be known to persons skilled in the relevant art(s).

Figure 10:
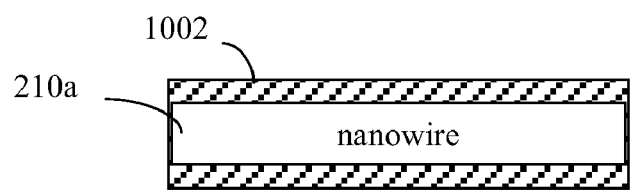
FIG. 10 shows a side cross-sectional view of a nanowire coated with a gate oxide layer, according to an example embodiment of the present invention.
Figure 11:
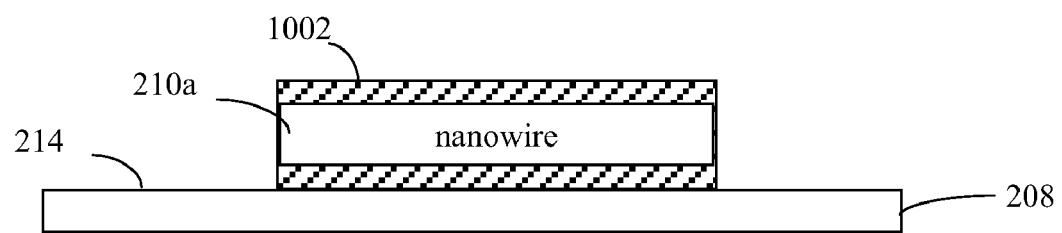
FIG. 11 shows the nanowire of FIG. 10 deposited on a substrate, according to an example embodiment of the present invention.

For example, in an embodiment, prior to step 502 of flowchart 800, nanowire(s) 210 may have a gate oxide layer formed thereon. For instance, nanowire(s) 210 may have a dielectric shell of oxide (e.g., $SiO_2$) grown thereon in a manner known to persons skilled in the relevant art(s). FIG. 10 shows a side cross-sectional view of a nanowire 210a with a gate oxide layer 1002 formed thereon, and deposited on substrate 208, according to an example embodiment of the present invention. Gate oxide layer 1002 may have any thickness as desired, such as in the thousands of Angstroms (e.g., 6000 Angstroms). Gate oxide layer 1002 may be formed on nanowire 210a prior to or after nanowire 210a is deposited on substrate 208 in step 802. FIG. 11 shows nanowire 210a of FIG. 10 deposited on substrate 208.

Figure 12:
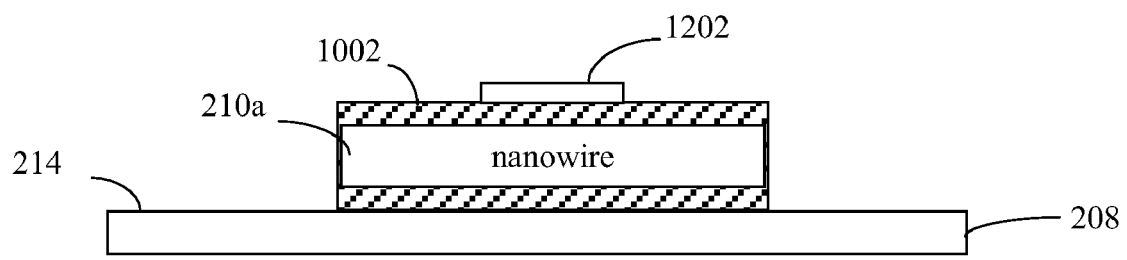
FIG. 12 shows a cross-sectional view of a gate material formed on the nanowire of FIG. 11, according to an example embodiment of the present invention.

In another embodiment, prior to step 502 of flowchart 800, a gate material such as a gate metal may be formed on nanowire(s) 210. For example, a gate mask can be used to mask selected regions of nanowire(s) 210, followed by deposition of a gate material (e.g., a-Si) in the exposed regions. For instance, FIG. 12 shows a gate material 1202 formed on gate oxide layer 1002 of nanowire 210a of FIG. 11, according to an example embodiment of the present invention. Gate material 1202 may have any thickness and area as desired.

In another embodiment, first and second metal contacts may be formed on nanowire(s) 210 rather than on substrate 208 as in flowchart 800. Furthermore, step 502 of annealing nanowire(s) 210 may be performed prior to formation of the first and second metal contacts. For example, in an embodiment, polarized laser beam 216 may be used to anneal nanowire(s) 210 as shown in FIG. 11 (prior to formation of gate material 1202) or as shown in FIG. 12 (after depositing gate material 1202). This annealing of nanowire(s) 210 activates the doped regions prior to formation of the first and second metal contacts.

Figure 13:
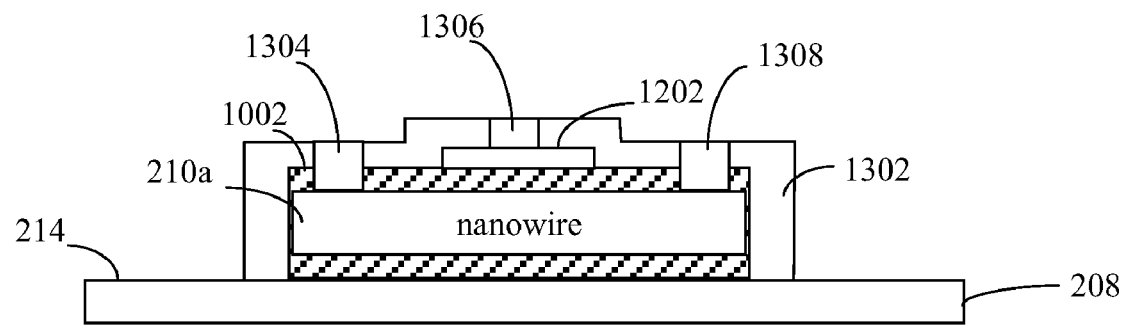
FIG. 13 shows a cross-sectional view of the nanowire of FIG. 12 having a passivation layer formed thereon, according to an embodiment of the present invention.

FIG. 13 shows a cross-sectional view of nanowire 210a, according to an embodiment of the present invention. As shown in FIG. 13, a passivation layer 1302, such as a thermal oxide or nitride (e.g., AlO, SiN, etc.), may be formed on nanowire 210a after laser annealing. Furthermore, vias 1304, 1306, and 1308 may be patterned in passivation layer 1302 (e.g., using lithography, photoresist strips, etc.) positioned where it is desired to deposit source, gate, and drain contacts, respectively. Furthermore, as shown in FIG. 13, portions of gate oxide layer 1002 may be patterned/removed (e.g., using a buffered oxide etch (BOE) process, or other dry etch process) to expose core nanowire 210a, so that source and drain contacts may be formed in contact with nanowire 210a.

Figure 14:
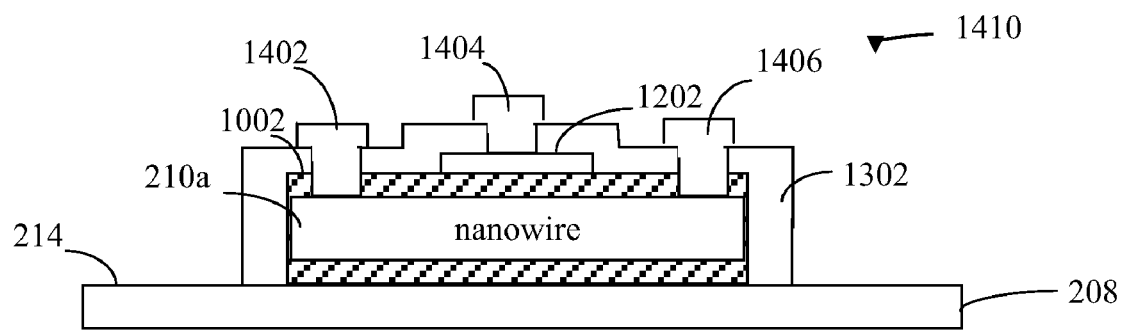
FIG. 14 shows the nanowire of FIG. 13 with electrical contacts deposited thereon to form an electrical device, according to an example embodiment of the present invention.

FIG. 14 shows an electrical device 1410 formed by forming electrical contacts through vias 1304, 1306, and 1308 shown in FIG. 13, according to an example embodiment of the present invention. As shown in FIG. 14, an electrically conductive material is deposited in source, gate, and drain contact regions to form a source contact 1402, a gate contact 1404, and a drain contact 1406. In this manner, a three terminal (e.g. transistor) electrical device 1410 may be formed. Contacts 1402-1406 can be any suitable conductive material, including organic (conducting polymers) or inorganic (e.g., a metal or combination of metals/alloy), and can be painted, electroplated, evaporated, sputtered, spun on, or applied as described or reference elsewhere herein, or otherwise known. In embodiments, nanowires similar to nanowire 210a of a thin film of nanowires span all the way between source contact 1402 and drain contact 1406. Hence, electric carriers can transport through the nanowires, which may be single crystal nanowires, resulting in a high mobility that is virtually impossible to obtain with current amorphous and polysilicon technologies.

Example Polarized Laser Annealing Embodiments

As described above, pulsed laser annealing of nanowires is an efficient way for activating incorporated dopants and repairing implantation damage in a process that is compatible with temperature sensitive flexible substrates. Detailed example embodiments of pulsed laser annealing of nanowires by visible radiation are described as follows. These embodiments are provided for purposes of illustration, and are not intended to be limiting.

In an embodiment, electrical devices configured similar to electrical devices 220 shown in FIG. 2 are formed. Silicon nanowires to be used as nanowire(s) 210 were grown using a Vapour-Liquid-Solid (VLS) method, using gold colloids as catalysts. The nanowires were thermally oxidized to form a ~10-20 nm conformal oxide shell around the silicon core. A mean diameter of the formed nanowire core-shell structures is 60-70 nm. A quartz wafer was used as substrate 208, and coated with solutions of the silicon nanowires (according to step 802 shown in FIG. 8). The nanowires were deposited on the quartz wafer aligned along a predominant direction to within ±15 °.

Contact regions were defined (according to step 804) on the quartz substrate and implanted (according to step 806) using a $BF_2$+ beam-line implant at a dose of $2\times10^{15}$ cm$^{-2}$ at 15 keV. The contact regions were activated (according to step 808) using a rapid thermal annealing process at 950° C. for 10 seconds. Such thermal annealing may be performed to enable low resistance contacts when desired. For example, in the current case, low resistance contacts were desired to minimize an electrical effect of the contact regions, to test the electrical effects of laser annealing. Thus, in non-test situations, the thermal annealing of the contact regions may not be necessary. Metal electrodes 212a and 212b were formed (according to step 810) by sputter-depositing (after oxide removal), to form a first layer of titanium (80 nm) and a second layer of aluminum (150 nm). The electrodes 212a and 212b were spaced apart 10-15 μm. The remaining portion of the silicon nanowires (e.g., nanowire region 304) were ion implanted with $BF_2+$ to provide boron-doped wires (according to step 812). The electrical devices fabricated according to this process each typically included approximately 1-5 nanowires with contacts to both of electrodes 212a and 212b.

An Nd:YAG laser was used as laser 202 for annealing of the doped nanowires, to electrically activate the dopants and repair the damage caused due to implantation in the silicon nanowires. A second harmonic output for a visible wavelength of 532 nm from the Nd:YAG laser was used, at a pulse width of 3-5 ns. The silicon nanowires were subjected to a substantially uniform laser fluence. A micro-lens array homogenizer was used in optics 204 (e.g., as homogenizer assembly 402) to achieve a flat-top beam profile with a non-uniformity of less than 10% in the flat-top region. A flat-top size of approximately 7.5 mm by 7.5 mm was generated. Multiple pulses were run at a repetition rate of 1 Hz.

In an embodiment, the Nd:YAG laser beam emits a horizontally polarized laser beam 216 that exits the second harmonic generator. Consequently, the formed electrical devices were positioned with respect to the Nd:YAG laser to control the angle between the incident polarization and the alignment direction of the nanowires. For test purposes, the nanowires may be monitored by performing two-point probe electrical measurements at electrodes 212a and 212b to measure a resistance of the fabricated electrical devices. For instance, a semiconductor parameter analyzer may be used to monitor the formed electrical device in this manner.

To laser anneal nanowires of the formed electrical devices, the electrical devices were irradiated with laser pulses. For test purposes, a resistance of the electrical devices was recorded after a desired number of pulses. In place electrical monitoring tests were performed in this manner for two different polarization cases—the laser beam electric field parallel to the predominant alignment direction of the silicon nanowires, and the electric field perpendicular to the predominant direction of alignment of the silicon nanowires (hereafter referred to as cases A and B, respectively). The electrical devices typically had resistance levels (across electrical contacts 212a and 212b) in the order of Giga-Ohms prior to laser annealing.

Figure 15:
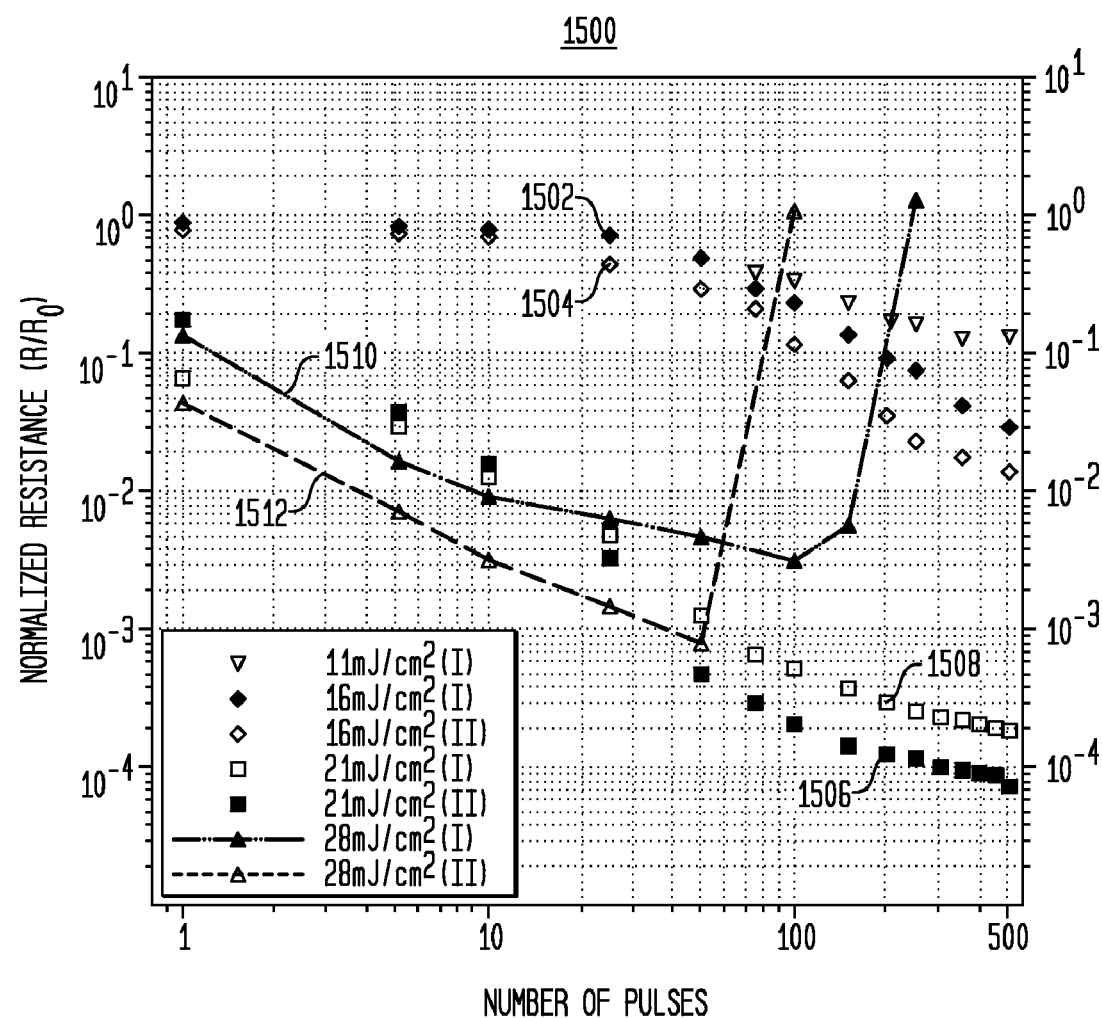
FIG. 15 shows a graph plotting normalized resistance versus a number of pulses for a parallel polarization mode, according to an example embodiment of the present invention.

FIG. 15 shows a graph 1500 plotting normalized resistance versus a number of pulses for parallel polarization in the present example (case A). As indicated in graph 1500 by plot lines 1502 and 1504 (points shown in FIG. 15 as dark and light diamonds, respectively), at laser fluence levels lower than 16 mJ/cm², an improvement in the conductance occurs when subjected to multiple pulse irradiation. For the electrical devices having silicon nanowires irradiated at a higher fluence level of 21 mJ/cm², as indicated in graph 1500 by plot lines 1506 and 1508 (points shown in FIG. 15 as dark and light squares, respectively) conductance increases of the order of $10^4$ times that of non-annealed nanowires occurred. This increase in conductance (decrease in resistance) at higher fluences may be due to higher temperatures induced in the nanowires as compared to lower fluences. During a thermal annealing of bulk silicon, low temperature processing aids in the removal of crystalline defects. Higher temperatures are needed for activating higher fractions of implanted dopants (which have activation energies of the order of a few eVs). As a consequence, higher fluences may be needed to provide sufficient energy for the activation of the implanted dopants in the silicon nanowire.

As indicated in graph 1500 by plot lines 1510 and 1512, by increasing to a fluence of 28 mJ/cm2, conductance initially increased, but subsequently dropped to lower values, eventually resulting in loss of signal. This indicates that a damage threshold of the nanowires had been reached, which may be further confirmed by the examination of the structure of the nanowires after laser annealing. Ion implantation (doping) leads to the introduction of defects within the silicon nanowires that were grown as single crystalline wires. A structure of the silicon nanowires in case A at 15 mJ/cm² and 21 mJ/cm² is crystalline. However, at 30 mJ/cm², the nanowires show damage. The damage is in the form of void formation in the silicon core, melting and recrystallization within the oxide shell, and beading up of the nanowires. Such structural changes leading to the damage of the nanowires cause the sharp decrease in the conductance of the nanowires near or above the melting threshold. A nucleation of defects in ion-implanted bulk silicon during non-melt laser annealing has previously been found to be dependent on the number of pulses and laser fluence levels. Multiple pulses at higher incident energy levels are more likely to cause defect formation in the nanowires, and to eventually lead to deterioration of the crystalline structure, which may be why the initial decrease in resistance is followed by an increase upon further pulsing.

Figure 16:
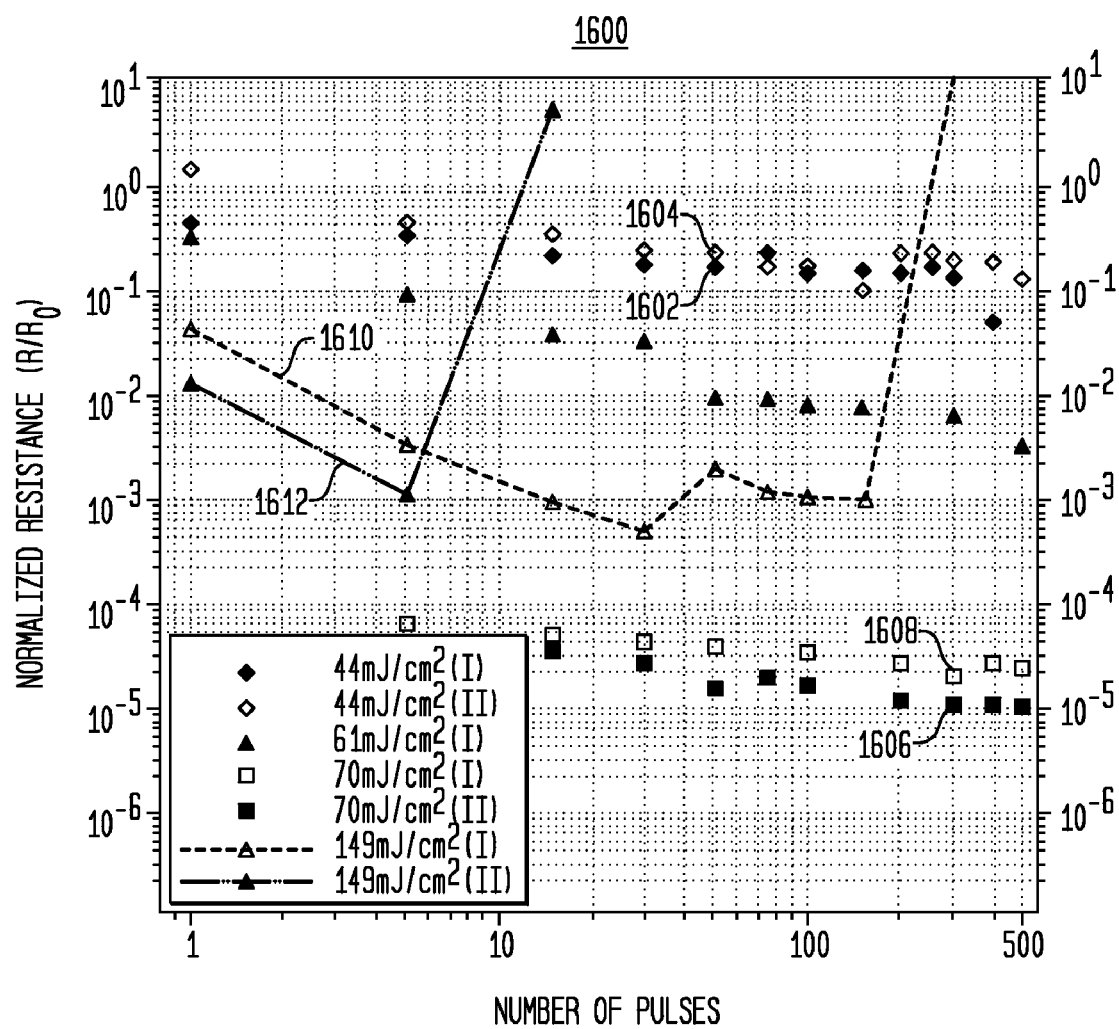
FIG. 16 shows a graph plotting normalized resistance versus a number of pulses for a perpendicular polarization mode, according to an example embodiment of the present invention.

FIG. 16 shows a graph 1600 plotting normalized resistance versus a number of pulses for perpendicular polarization in the present example (case B). As indicated by a comparison of graph 1500 to graph 1600, absorption is much stronger in the silicon nanowires when polarization is parallel to the axis of the nanowires (case A) rather than when polarization is perpendicular (case B) to the axis of the nanowires.

As indicated in graph 1600 by plot lines 1602 and 1604 (points shown in FIG. 16 as dark and light diamonds, respectively), at a fluence of approximately 44 mJ/cm², which is a greater fluence than the melting threshold of the silicon nanowires in case A, damage to the nanowires was not apparent. As fluence is increased, a faster increase in conductance occurs. As indicated in graph 1600 by plot lines 1606 and 1608 (points shown in FIG. 16 as dark and light squares, respectively), at approximately 71 mJ/cm², the conductance of the nanowires increases by approximately $10^4$-$10^5$. A further increase in the fluence levels (e.g., as indicated by plot lines 1610 and 1612 in FIG. 16), eventually lead to melting and damage. For example, silicon nanowires may show damage at approximately 100 mJ/cm² in case B.

In case B, relative to case A, larger fluences are required to anneal and/or damage the silicon nanowires. In both of cases A and B, a threshold fluence for nanowire damage is lower than reported threshold values for melting silicon thin films and bulk silicon, which are typically hundreds of millijoules per square centimeter. This may be due to a strong absorption efficiency of nanowires, and small heat losses to the ambient environment and due to a thermal conductance to the substrate. The latter attribute may be responsible for a prolonged cooling cycle, thereby allowing the nanowires to reside longer at an elevated temperature, facilitating an efficient annealing process. Assuming bulk silicon thermal properties, at a fluence level of approximately 30 mJ/cm² for a 30 nm wire with an absorption efficiency of 0.1, a temperature rise of about 790 K is predicted if all the absorbed energy were to heat the nanowire. Such an estimate would predict a linear dependence on the fluence and a strong dependence on the diameter of the nanowires as approximately $\sigma_{abs}/r$, where $\sigma_{abs}$ is the absorption cross-section of a nanowire and "r" is the radius of a nanowire. Hence, nanowire diameters which exhibit absorption peaks would be heated to higher temperatures. In particular, a temperature rise in smaller nanowires would be accentuated due to the inverse proportionality to the diameter. However, this is a simplified calculation to be taken as qualitative guidance with caution, because it does not take into account more intricate effects such as thermal losses from the nanowires, size and temperature dependent thermal properties of the nanowires, or free carrier absorption and temperature dependent optical properties.

Figure 17:
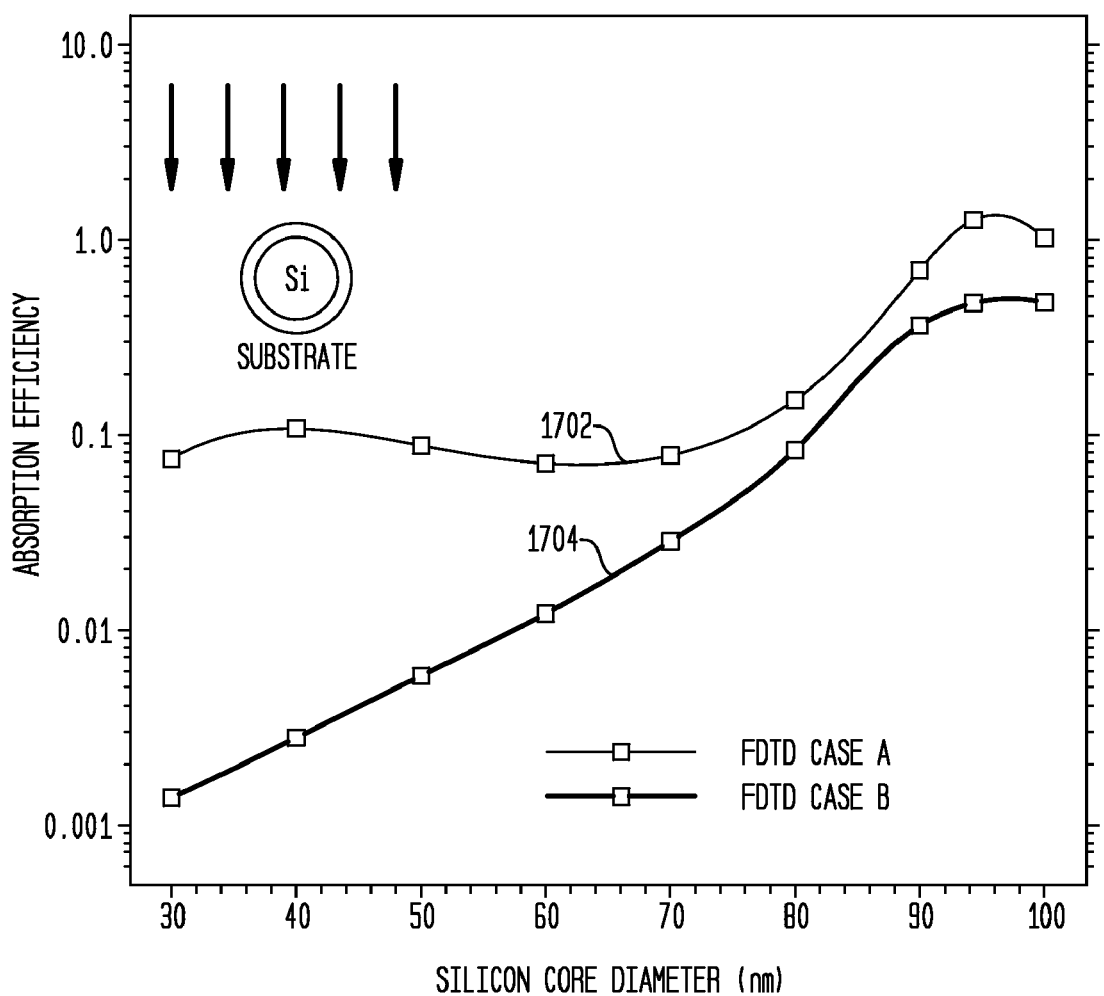
FIG. 17 shows a graph of plots of absorption efficiency versus silicon nanowire core diameter for simulations regarding parallel and perpendicular polarization modes, according to example embodiments of the present invention.

A Finite Difference Time Domain (FDTD) technique may be used to calculate field distributions within core-shell nanowires to estimate the absorption of radiation by silicon nanowires during laser annealing. FIG. 17 shows a graph 1700 of absorption efficiency versus silicon nanowire core diameter (in nanometers) for FDTD simulations for cases A and B. A plot 1702 indicates absorption efficiency versus nanowire diameter for case A, and a plot 1704 indicates absorption efficiency versus nanowire diameter for case B. To verify the predictions of absorption using the FDTD simulations, the simulation results may be compared to the analytical solution of Maxwell's Equations for infinitely long circular cylinders of different diameters. Good agreement was observed between the analytical and FDTD predictions of absorption. As indicated by graph 1700, different sizes of silicon nanowires lead to different absorption levels by the silicon nanowires. As indicated by plot 1702, an absorption peak may be present at nanowire core diameters of around 40 nm, in the case of polarization parallel to the nanowires. This may be due to resonance-enhanced absorption in silicon nanowires at visible wavelengths, and/or an enhanced photothermal effect that can lead to strong absorption in thin silicon nanowires. The cylindrical geometry of nanowires leads to stronger absorption at smaller diameters for polarization parallel to the nanowires, which is absent in the case when polarization is perpendicular to the nanowires.

The exhibited polarization anisotropy with regard to absorption can have several benefits in the processing of nanowires. For example, a process window for compatibility with various substrates is broadened. Melting/damage to the nanowires occurs at different fluence levels depending upon the polarization. This 'dual threshold' of the silicon nanowires, due to the different thresholds for parallel and perpendicular polarization, enables selective melting and possibly ablation of particular silicon nanowires. Nanowires in unwanted directions could be removed using such a technique, enabling improved alignment and tighter size distribution of the nanowires. For example, in an embodiment, laser beam 216 may be perpendicularly polarized with respect to desired nanowires (e.g., extending between contacts 212a and 212b parallel to axis 306), while being parallel polarized with respect to unwanted nanowires (e.g., that are not parallel to axis 306). The higher damage threshold for nanowires receiving perpendicularly polarized radiation enables them to remain, while the lower damage threshold for nanowires receiving parallel polarized radiation enables them to be selectively melted and/or ablated.

Different nanowires and dopants can be activated by control of the polarization and nanowire directions. In electrical devices using a crossed-nanowire layout, the electrical device fabrication process flow may need to be more carefully configured, but the above described effects can be used advantageously to process the silicon nanowires. The selective nature of such processing also can be adapted to implement layer-by-layer nanowire based devices. Alignment of the nanowires and/or the use of intermediate layers between layers of nanowires can be used for sequential processing, which is not possible by conventional thermal techniques. Furthermore, embodiments may be extended to induce temperature based reactions in nanowires, such as silicidation and controlled phase change.

In cases where the effect of polarization on nanowires is not desired, such as when silicon nanowires are desired to be annealed irrespective of their orientation, laser annealing can be performed below the lower melting threshold using circularly polarized light, with larger number of pulses, to ensure all the silicon nanowires are annealed as desired.

Embodiments enable laser annealing with temperature sensitive substrates. Although cases A and B relate to electrical devices on a quartz substrate, some plastic substrates, such as PET (polyethylene terephthalate) and PEN (polyethylene naphthalate) substrates, have damage thresholds higher than the fluence levels required to anneal the silicon nanowires at 532 nm, as described above. Example damage threshold of plastics due to radiation by the Nd:YAG laser is between 120 mJ/cm$^2$ and 130 mJ/cm$^2$ with over 100 pulses.

Use of Nanowires and Electrical Devices Deposited According to the Present Invention in Exemplary Devices and Applications Numerous electronic devices and systems can incorporate semiconductor or other type devices with thin films of nanowires and/or electrical devices deposited according the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The electrical devices formed as described herein can also be incorporated in applications requiring a single semiconductor device, and in multiple semiconductor devices. For example, the electrical devices formed as described herein are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The electrical devices formed as described herein are also applicable to smart libraries, credit cards, large area array sensors, and radio-frequency identification (RFID) tags, including smart cards, smart inventory tags, and the like.

The electrical devices formed as described herein are also applicable to digital and analog circuit applications. In particular, the electrical devices formed as described herein are useful in applications that require ultra large-scale integration on a large area substrate. For example, a thin film of nanowires deposited by the processes and methods of the present invention can be implemented in logic circuits, memory circuits, processors, amplifiers, and other digital and analog circuits.

The electrical devices formed as described herein can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate electrical devices formed by the processes and methods of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A method for fabricating an electrical device, comprising:
   depositing a first at least one nanowire on a substrate;
   forming first and second metal electrodes, the first at least one nanowire being in electrical contact with the first and second metal electrodes;
   doping the first at least one nanowire; and
   applying a polarized laser beam to a plurality of nanowires on the substrate that includes the first at least one nanowire and a second at least one nanowire, the polarized laser beam having a fluence level and a polarization that anneals the first at least one nanowire and ablates the second at least one nanowire on the substrate.

2. The method of claim 1, wherein said depositing comprises:
   aligning the first at least one nanowire to be substantially parallel to an axis.

3. The method of claim 1, wherein said applying comprises:
   polarizing the laser beam in a direction substantially parallel to the axis.

4. The method of claim 2, wherein said applying comprises:
   polarizing the laser beam in a direction substantially perpendicular to the axis.

5. The method of claim 4, wherein said applying further comprises:
   irradiating the first at least one nanowire and the second at least one nanowire with the polarized laser beam at a fluence level less than 100 mJ/cm$^2$.

6. The method of claim 1, further comprising:
   selecting a fluence level of the polarized laser beam to anneal the first at least one nanowire without melting the first at least one nanowire.

7. The method of claim 1, wherein said applying comprises:
   pulsing the polarized laser beam.

8. The method of claim 1, further comprising:
   forming a third electrode in electrical contact with the first at least one nanowire.

9. The method of claim 1, wherein said applying comprises:
   forming the polarized laser beam to have a substantially flat top beam profile.

10. The method of claim 1, wherein said applying comprises:
    generating the polarized laser beam to have a visible light frequency.

11. An electrical device fabricated according to the method of claim 1.

12. A method for annealing nanowires, comprising:
    irradiating at least a portion of a first at least one nanowire and a second at least one nanowire with a polarized laser beam having a visible light frequency, a fluence level, and a polarization to simultaneously anneal the first at least one nanowire and ablate the second at least one nanowire.

13. The method of claim 12, further comprising:
    positioning the first at least one nanowire and the second at least one nanowire on a transparent substrate; and
    wherein the polarized laser beam transmits through the transparent substrate during said irradiating without causing substantial damage to the transparent substrate.

* * * * *